(12) United States Patent
Anholt et al.

(10) Patent No.: US 9,053,809 B2
(45) Date of Patent: Jun. 9, 2015

(54) DATA PROTECTION FROM WRITE FAILURES IN NONVOLATILE MEMORY

(75) Inventors: Micha Anholt, Tel Aviv (IL); Barak Baum, Givatayim (IL); Alexander Paley, Kfar-Saba (IL)

(73) Assignee: Apple Inc., Cupertino, CA (US)

( * ) Notice: Subject to any disclaimer, the term of this patent is extended or adjusted under 35 U.S.C. 154(b) by 327 days.

(21) Appl. No.: 13/592,561

(22) Filed: Aug. 23, 2012

(65) Prior Publication Data

US 2013/0117606 A1 May 9, 2013

Related U.S. Application Data

(60) Provisional application No. 61/557,428, filed on Nov. 9, 2011.

(51) Int. Cl.
| | |
|---|---|
| *G11C 16/34* | (2006.01) |
| *G06F 11/10* | (2006.01) |
| *G06F 12/00* | (2006.01) |
| *G06F 12/02* | (2006.01) |
| *G06F 11/14* | (2006.01) |

(52) U.S. Cl.
CPC ........ *G11C 16/3459* (2013.01); *G06F 11/1076* (2013.01); *G06F 11/1008* (2013.01); *G06F 11/1068* (2013.01); *G06F 11/1016* (2013.01); *G06F 12/00* (2013.01); *G06F 12/0246* (2013.01); *G06F 11/1402* (2013.01); *G06F 11/108* (2013.01); *G06F 11/1048* (2013.01)

(58) Field of Classification Search
CPC ............. G06F 11/076; G06F 11/1048; G06F 11/1008; G06F 11/1016; G06F 11/108; G06F 11/1068; G06F 11/1402; G06F 12/00; G06F 12/0246; G11C 16/3459

USPC ........... 714/63, 766, 768, 769, 770, 773, 800, 714/6.1, 6.11, 6.2, 6.21, 6.24
See application file for complete search history.

(56) References Cited

U.S. PATENT DOCUMENTS

| | | | | |
|---|---|---|---|---|
| 5,418,921 | A * | 5/1995 | Cortney et al. | 711/114 |
| 7,240,178 | B2 * | 7/2007 | Nakada et al. | 711/203 |
| 8,225,136 | B2 * | 7/2012 | Igashira et al. | 714/6.22 |
| 8,365,041 | B2 * | 1/2013 | Olbrich et al. | 714/763 |
| 8,473,814 | B2 * | 6/2013 | Olbrich et al. | 714/763 |
| 8,484,533 | B2 * | 7/2013 | Olbrich et al. | 714/763 |

(Continued)

FOREIGN PATENT DOCUMENTS

| | | |
|---|---|---|
| JP | 05-282886 | 10/1993 |
| JP | 2003036209 | 2/2003 |
| KR | 1020100052041 | 5/2010 |

OTHER PUBLICATIONS

International Search Report and Written Opinion in application No. PCT/US12/63813 mailed Jan. 2, 2013, pp. 1-12.

(Continued)

*Primary Examiner* — John J Tabone, Jr.
(74) *Attorney, Agent, or Firm* — Meyertons, Hood, Kivlin, Kowert & Goetzel, P.C.

(57) ABSTRACT

A method includes calculating redundancy information over a set of data items, and sending the data items for storage in a memory. The redundancy information is retained only until the data items are written successfully in the memory, and then discarded. The data items are recovered using the redundancy information upon a failure in writing the data items to the memory.

20 Claims, 3 Drawing Sheets

(56) References Cited

U.S. PATENT DOCUMENTS

| | | | |
|---|---|---|---|
| 8,555,027 B2* | 10/2013 | Kimura et al. | 711/206 |
| 2008/0198650 A1* | 8/2008 | Shalvi et al. | 365/185.02 |
| 2009/0313498 A1* | 12/2009 | Igashira et al. | 714/6 |
| 2010/0318721 A1* | 12/2010 | Avila et al. | 711/103 |
| 2010/0318839 A1* | 12/2010 | Avila et al. | 714/5 |
| 2010/0321998 A1 | 12/2010 | Jang | |
| 2010/0332948 A1* | 12/2010 | Suganuma | 714/763 |
| 2011/0078496 A1* | 3/2011 | Jeddeloh | 714/6.24 |
| 2011/0161784 A1* | 6/2011 | Selinger et al. | 714/768 |
| 2011/0228601 A1* | 9/2011 | Olbrich et al. | 365/185.03 |
| 2011/0231732 A1* | 9/2011 | Chu | 714/763 |
| 2011/0302446 A1* | 12/2011 | Becker-Szendy et al. | 714/6.1 |
| 2012/0144249 A1* | 6/2012 | Franceschini et al. | 714/54 |
| 2012/0254694 A1* | 10/2012 | Golov et al. | 714/763 |
| 2012/0311406 A1* | 12/2012 | Ratnam et al. | 714/768 |
| 2013/0007509 A1* | 1/2013 | Arakawa et al. | 714/6.1 |
| 2013/0219248 A1* | 8/2013 | Sakurai | 714/766 |
| 2014/0157084 A1* | 6/2014 | Shalvi et al. | 714/768 |
| 2014/0351633 A1* | 11/2014 | Grube et al. | 714/6.24 |
| 2014/0380128 A1* | 12/2014 | Baptist et al. | 714/770 |

OTHER PUBLICATIONS

Notice of Preliminary Rejection from Korean Patent Application No. 10-2012-126838, mailed Jan. 21, 2014, English and Korean Versions, pp. 1-10.
Extended European Search Report in Application No. 12191949.2-1805, Mar. 14, 2013, pp. 1-7.
International Preliminary Report on Patentability from PCT/US2012/063813, mailed May 22, 2014, Apple Inc., pp. 1-6.
Office Action from European Application No. 12191949.2, dated May 22, 2014, Apple Inc., pp. 1-10.
Notice of Allowance from Korean Application No. 102012126838, issued Aug. 18, 2014, Korean versions, pp. 1-3.
Office Action from Taiwanese Application No. 101141622, issued Dec. 19, 2014, English and Chinese versions, pp. 1-13.

* cited by examiner

DATA PROTECTION FROM WRITE FAILURES IN NONVOLATILE MEMORY

CROSS-REFERENCE TO RELATED APPLICATIONS

This application claims the benefit of U.S. Provisional Patent Application 61/557,428, filed Nov. 9, 2011, whose disclosure is incorporated herein by reference.

FIELD OF THE INVENTION

The present invention relates generally to data storage, and particularly to methods and systems for protecting data from write failures in memory devices.

BACKGROUND OF THE INVENTION

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as storage values or analog values. In Flash memories, for example, each analog memory cell holds a certain amount of electrical charge. The range of possible analog values is typically divided into regions, each region corresponding to a programming state that represents one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, stores two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24th International Conference on Microelectronics (MIEL), Nis, Serbia and Montenegro, May 16-19, 2004, volume 1, pages 377-384, which is incorporated herein by reference.

Various methods for programming and erasing analog memory cells are known in the art. Some memory devices use an iterative programming and verification (P&V) process that applies a sequence of pulses to a group of memory cells and verifies the programmed values during the sequence.

Various techniques are known in the art for protecting data in memory devices against failures. For example, U.S. Pat. No. 5,533,190, whose disclosure is incorporated herein by reference, discloses a method for assuring consistency between data and parity in a disk array system following a reset or a power failure condition which interrupts the execution of write I/O operations. The method includes the steps of: examining drive activities to identify unfinished write I/O operations due to an interrupt condition; logging information necessary to identify the unfinished operations and the array redundancy groups associated with the unfinished operations into a non-volatile memory; and checking for log entries in the non-volatile memory during a disk array subsystem initialization or the restoration of power. For each unfinished operation identified in the log, the method further includes the steps of: performing a bit-wise exclusive-OR of corresponding portions of the data stored within the associated redundancy group to calculate parity consistent therewith; and writing the calculated parity to the parity storage areas within the associated redundancy group. For an array operating with a failed disk drive member (i.e., in degraded mode), the method also logs information necessary to identify the storage areas to which the unfinished write I/O operations map new data and parity, and some form of the old data and parity information saved to that storage areas to which the unfinished write I/O operations map new data and parity. Following the system reset, or restoration of power, consistent parity is determined for each associated redundancy group.

U.S. Pat. No. 7,487,394, whose disclosure is incorporated herein by reference, discloses a method in which data associated with the state of a parity update operation in a disk array system such as a RAID-6 system is stored during performance of the operation so that, in the event the operation is interrupted, recovery may be initiated using the stored data. The stored data may include a state indicator that is indicative of the status of the parity update operation, and snapshot data (e.g., a delta value indicative of a difference between new and old data) captured during the parity update operation.

SUMMARY OF THE INVENTION

An embodiment that is described herein provides a method including calculating redundancy information over a set of data items. The data items are sent for storage in a memory. The redundancy information is retained only until the data items are written successfully in the memory. The redundancy information is then discarded. The data items are recovered using the redundancy information upon a failure in writing the data items to the memory.

In some embodiments, retaining the redundancy information includes discarding the redundancy information only after successful completion of all write operations whose failure would corrupt the data items in the set. In other embodiments, retaining the redundancy information includes discarding the redundancy information only after successful programming of all pages in all word lines holding the set of the data items.

In some embodiments, sending the data items for storage and retaining the redundancy information include storing both the data items and the redundancy information in a same memory block of the memory. In other embodiments, sending the data items for storage and retaining the redundancy information include storing both the data items and the redundancy information in the memory in accordance with a predefined page programming order that is supported by the memory. In yet other embodiments, retaining the redundancy information includes storing the redundancy information in a storage location outside the memory.

In some embodiments, sending the data items includes storing the data items in a first memory block of the memory, and retaining the redundancy information includes storing the redundancy information in a second memory block of the memory, different from the first memory block. In other embodiments, the second memory block is dedicated for redundancy information storage and does not store any data items.

In some embodiments, sending the data items for storage and retaining the redundancy information include writing a first subset of the data items to first data portions of respective word lines of the memory, and then writing the redundancy information for the first subset to a first data portion of a subsequent word line. After writing the first subset and the redundancy information, a second subset of the data items is written to second data portions of the respective word lines and of the subsequent word line. The redundancy information is discarded upon successfully writing the second subset.

There is additionally provided, in accordance with an embodiment that is described herein, apparatus including an interface and a processor. The interface communicates with a memory. The processor is configured to calculate redundancy information over a set of data items, to send the data items for storage in the memory, to retain the redundancy information only until the data items are written successfully in the memory and then discard the redundancy information, and to recover the data items using the redundancy information upon a failure in writing the data items to the memory.

There is additionally provided, in accordance with an embodiment that is described herein, apparatus including a memory and a processor. The processor is configured to calculate redundancy information over a set of data items, to send the data items for storage in the memory, to retain the redundancy information only until the data items are written successfully in the memory and then discard the redundancy information, and to recover the data items using the redundancy information upon a failure in writing the data items to the memory.

The present invention will be more fully understood from the following detailed description of the embodiments thereof, taken together with the drawings in which:

DETAILED DESCRIPTION OF EMBODIMENTS

Overview

Figure 1:
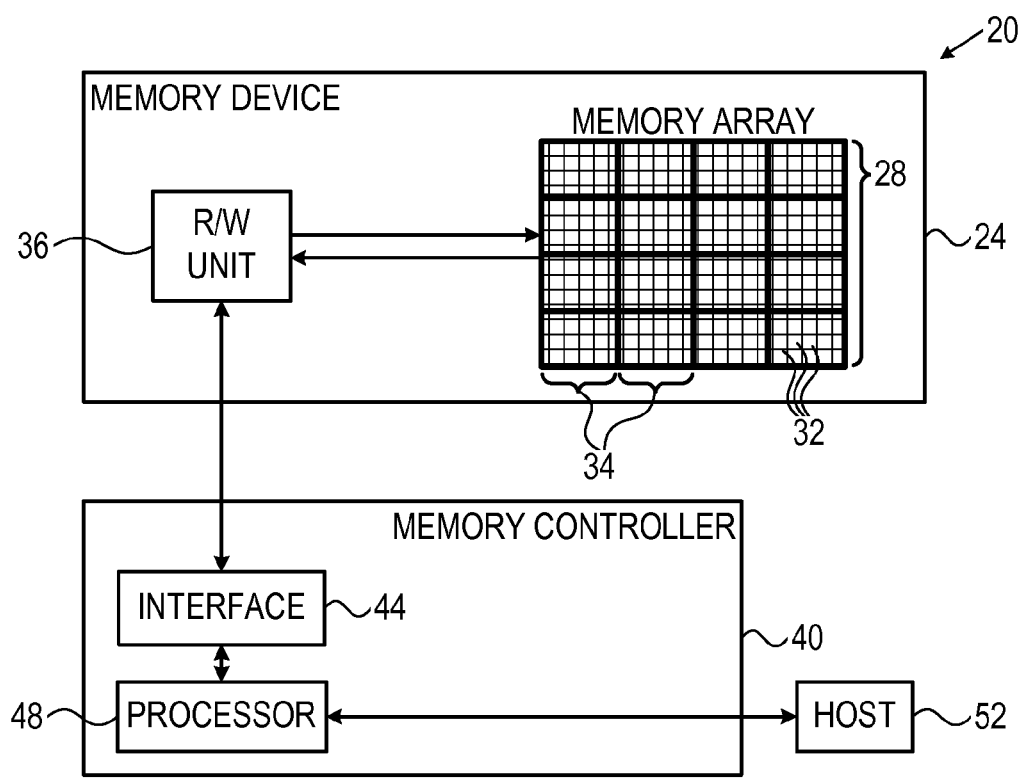
FIG. 1 is a block diagram that schematically illustrates a memory system, in accordance with an embodiment of the present invention.

In nonvolatile memories, such as Flash memory, data is typically stored in analog memory cells by programming the respective memory cells to respective analog values that represent the stored bit values. Each bit value corresponds to a respective programming level or programming state, which is represented by a certain region of analog values. A typical Flash memory is divided into multiple memory blocks, where each block comprises multiple memory pages. Data is written and read in page units, but erased in memory block units (also referred to as physical blocks or erasure blocks).

Each memory block comprises an array of memory cells, wherein a row of memory cells are referred to as a word line (WL) and a column of memory cells are referred to as a bit line (BL). A single programming operation writes data items to memory cells within a word line row by applying a signal pulse on the word line, which is configured to change the analog value of a voltage stored in one or more of the memory cells connected to the word line.

Each word line may be divided into two or more groups of cells that are programmed separately. Two different groups of memory cells on a word line, which are programmed in separate write cycles, are usually interleaved with one another, and are denoted as even and odd cells. Physically, the even and odd cells are alternating memory cells on a word line. Programming the odd and even pages is accomplished by enabling every other bit line (e.g. every other memory cell on a word line) during a write cycle. Alternatively, all the memory cells of a word line may be programmed together, in a configuration that is sometimes referred to as All Bit Lines (ABL). In some memory devices, each group of memory cells in a word line (e.g., odd cells, even cells or all cells) stores more than a single page, by storing multiple bits in each memory cell.

If a write failure (e.g., power failure) occurs during a write cycle, the data that is currently being written will typically be lost. In addition, however, it is possible that data which has been previously written to the memory will be lost, as well. For example, data that was previously written on the same word line as the currently-written data can be lost as a result of the write failure.

For example, data previously written into an odd page of a word line can be lost, or corrupted, during a write cycle of data into an even page of the same word line during a write failure. In another example, data that was written into a certain page may be lost during failure to write a subsequent page into the same group of memory cells.

In many data storage applications, it is legitimate to lose the currently-written data as a result of write failure. Loss of previously-written data, however, is typically not permitted and should be avoided.

Embodiments of the present invention that are described hereinbelow provide improved methods for programming data in nonvolatile memory in order to minimize data loss in the event of a write failure. In some embodiments, a memory controller stores a set of data items, typically memory pages, in a memory. The memory controller calculates redundancy information, e.g., parity, over the set of data items. The memory controller stores the data items in the memory, and retains the redundancy information (either in the memory or elsewhere) until the set of data items is successfully stored. Upon successfully storing the set of data items, the memory controller discards the redundancy information. If a write failure (e.g., power interruption) occurs during storage of the set of data items, the memory controller reconstructs any lost data using the redundancy information.

Unlike some known schemes that retain redundancy information for long term storage, the disclosed techniques retain the redundancy information only temporarily—until the set of data items is stored successfully in the memory. As soon as the set of data items are stored without write failure, the redundancy information is discarded. As such, the disclosed techniques are highly efficient in terms of overhead and memory capacity.

In other words, the disclosed techniques are not aimed at protecting against memory failures that may occur at any time after programming the data (in which case it is necessary to store the redundancy information permanently with the data), but at protecting against failures (e.g., power interruptions) during the programming operation. As such, the disclosed techniques retain the redundancy information only temporarily, thus conserving memory space and management overhead.

In some embodiments, the order in which the data items and redundancy information are written into the various pages of the memory is predefined by considering the possible mechanisms of losing previous data. Consider, for example, a memory in which a write failure is likely to damage data to other pages in the same word line as the currently-written data. In such a case, the memory controller may use a predefined programming scheme in which the mapping of data items and redundancy information to memory pages ensures that, at any given time, any lost data can be reconstructed using successfully-stored data items and the redundancy information. Several examples of such programming schemes are described herein.

The disclosed schemes provide data protection, while at the same time incurring only a small additional number of write operations. Moreover, some of the disclosed techniques are able to provide data protection for data items that are programmed in the same memory block. In other words, these disclosed programming schemes do not require the memory controller to distribute the data items over multiple blocks for protection.

System Description

FIG. 1 is a block diagram that schematically illustrates a memory system 20, in accordance with an embodiment of the present invention. System 20 can be used in various host systems and devices, such as in computing devices, cellular phones and smartphones, other communication terminals, removable memory modules (sometimes referred to as "USB Flash Drives"), Solid State Drives (SSD), digital cameras, music and other media players and/or any other system or device in which data is stored and retrieved.

System 20 comprises a memory device 24, which stores data in a memory cell array 28. The memory cell array comprises multiple memory blocks 34. Each memory block comprises analog memory cells 32. In the context of the present patent application, the term "analog memory cell" is used to describe any memory cell that holds a continuous, analog value of a physical parameter, such as an electrical voltage or charge. Array 28 may comprise analog cells of any kind, such as, for example, NAND, NOR and Charge Trap Flash (CTF) cells, phase change RAM (PRAM, also referred to phase change memory—PCM), Nitride Read Only Memory (NROM), Ferroelectric RAM (FRAM), magnetic RAM (MRAM) and/or Dynamic RAM (DRAM) cells. The memory cells may be arranged in any suitable two- or three-dimensional connectivity scheme.

The charge levels stored in the cells and/or the analog values or currents written into and read out of the cells are referred to herein collectively as analog values, analog storage values or storage values. System 20 stores data in the analog memory cells by programming the cells to assume respective programming states, which are also referred to as programming levels. The programming states are selected from a finite set of possible states, and each programming state corresponds to a certain nominal storage value.

Single level cells (SLC) corresponds to storage at a density of 1 bit per cell, multi-level cells (MLC) refers to storage at a density of 2 or more bits per cell, and triple level cells (TLC) refers to data storage at a density of 3 bits per cell. The TLC can be programmed to assume one of eight possible programming states by writing one of eight possible analog storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data from memory device 24 are performed by a memory controller 40. The memory controller comprises an interface 44 for communicating with memory device 24, and a processor 48 that carries out the various memory management functions. In particular, processor 48 carries out programming schemes that protect the data against write failures, as will be explained in detail below.

Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each word line are connected together by a word line bus, and the sources of the transistors in each column are connected together by a bit line bus. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd cells and the other comprising the even cells as described previously.

Typically, memory controller 40 programs data in page units, but erases entire memory blocks 34. Typically although not necessarily, a memory block is on the order of $10^6$ memory cells, whereas a page is on the order of $10^3$-$10^4$ memory cells.

Write Failures and Potential Data Loss Scenarios

When writing data to nonvolatile memory during a write failure, the currently-written data can be legitimately lost, but any previously-written data, which may be lost, must be retrievable. The programming schemes described in the next section utilize the order of programming data onto the word lines to ensure that the previously-written data will be retrievable from redundancy data if lost during a write failure. As such, redundancy data is formed during the data programming and written either into a predefined location in the Flash, or other suitable storage media. Once the memory controller validates that the data write was successful, the redundancy information is then discarded.

In an example scenario, data is written using SLC programming into the same word line partitioned into odd and even cells. When data from a first previous write cycle is stored in the even cells, for example, and data during a second current write cycle is being written into the odd cells on the same word line when a write failure occurs, the data from the first previous write cycle the even cells can be corrupted (retroactive data corruption).

(The above example refers to a scenario where the odd cells on a given word line are programmed after the even cells, in which case a failure during the odd cell programming may corrupt the data stored in the even cells. By symmetry, the disclosed techniques can be applied in a similar manner in scenario where the even cells on a given word line are programmed after the odd cells.)

In another scenario, each of the even cells and odd cells on a given word line can be sequentially programmed with multiple pages, e.g., two or three pages. Such pages are commonly referred to as a least significant bit (LSB) page, a center significant bit (CSB) page and a most significant bit (MSB) page, as for the case of MLC/TLC page programming schemes. (CSB is sometimes referred to as upper significance page—USB.)

The previously written data on word lines onto which new data pages are being written are now subject to multiple mechanisms for potential data corruption in the event of a write failure in these scenarios. The pages most likely to be corrupted are grouped as described in the programming schemes described in the next section for MLC/TLC programming. The redundancy data from these groups is created by the memory controller and written to the nonvolatile memory or to another suitable storage medium. Once the data pages are successfully written, the redundancy information is discarded.

Protection Against Write Failures Using Temporary Redundancy Information

In some embodiments, processor 48 of memory controller 40 produces redundancy information over a set of pages by taking the logical XOR ⊕ of the different pages. This redundancy information can be referred in this patent application as the "backup", or "parity" data item P. For example, P is computed from three pages of data denoted A, B, C by $P=A \oplus B \oplus C$ and stored until A, B, and C are safely written into the memory after which P can be discarded. The example of three pages is shown merely for conceptual clarity and not by way of limitation of the embodiments of the present invention.

In the event of a power failure that causes page C, for example, to be corrupted, page C can be reconstructed from A, B, and P by $C=A \oplus B \oplus P$. Moreover, optimizing the order of writing the data items into the memory by predefined programming schemes optimizes the overhead and computational efficiency to compute and store the parity data, or redundancy information.

The embodiments described herein refer mainly to redundancy information that protects from failure of a single page, for the sake of clarity. If two or more pages are corrupted, a more complex redundancy scheme should be used. The disclosed techniques can be used with any such redundancy scheme.

The efficiency and speed of the methods described herein are typically dependent on the number of read and write operations, since read operations in Flash memory are usually much shorter than write operations. Once the data items are written, processor 48 discards the redundancy information. Write failures of data items requiring data reconstruction from the redundancy information are assumed to be rare events, such that the latency caused by a few extra read operations is negligible in the overall memory system performance.

Figure 2:
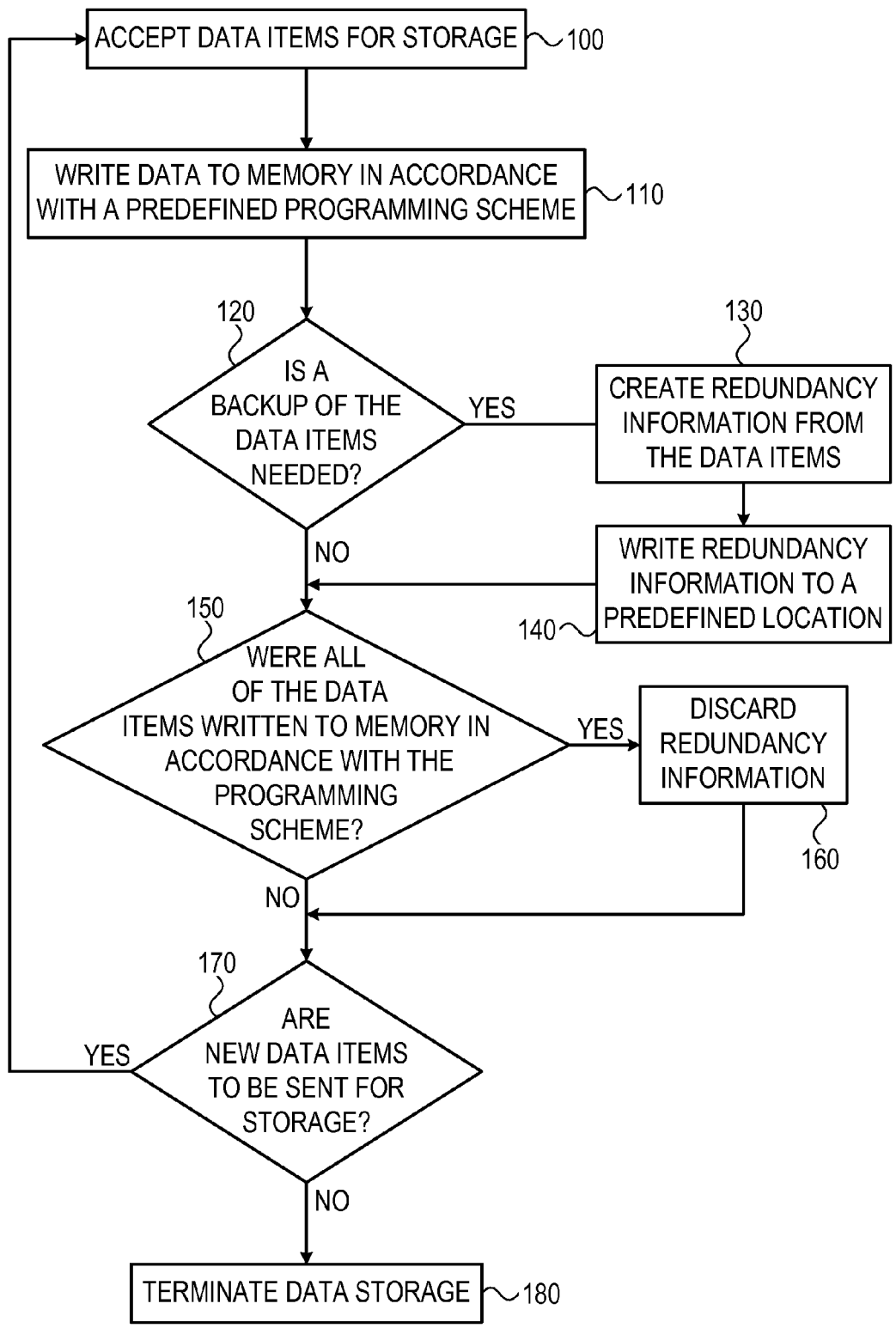
FIG. 2 is a flow chart that schematically illustrates a method for data storage for protection against write failures, in accordance with an embodiment of the present invention.

FIG. 2 is a flow chart that schematically illustrates a method for data storage for protection against write failures, in accordance with an embodiment of the present invention. In an acceptance step 100, memory controller 40 accepts from host 52 data items for storage. In a write step 110, the memory controller writes the data items to memory device 24 in accordance with a predefined programming scheme, which is configured by processor 48.

In a first decision step 120, processor 48 checks if a backup of the data items is needed. If so, processor 48 produces redundancy information, such as the parity data described previously, from the data items in a creation step 130. In a write step 140, processor 48 writes the redundancy information to a predefined location either in memory device 24, or to any other suitable storage medium (e.g., to a random access memory in the memory controller).

If a backup is not needed, processor 48 of memory controller 40 then assesses if all of the accepted data items from acceptance step 100 were written to memory in accordance with the programming scheme in a second decision step 150. If so, processor 48 discards the redundancy information at a discard step 160. If not, processor 48 assesses whether new data items are to be sent for storage, at a third decision step 170. If so, the method loops back to step 100 where new data items are accepted for storage. If not, data storage is terminated in a termination step 180.

Processor 48 of the memory controller may discard the redundancy information in various ways. In Flash-based systems, for example, processor 48 typically marks the page or pages of the redundancy information as invalid. As a result, the memory controller will not copy the redundancy information to a new block during compaction or "garbage collection," and the redundancy information will eventually be erased.

Figure 3:
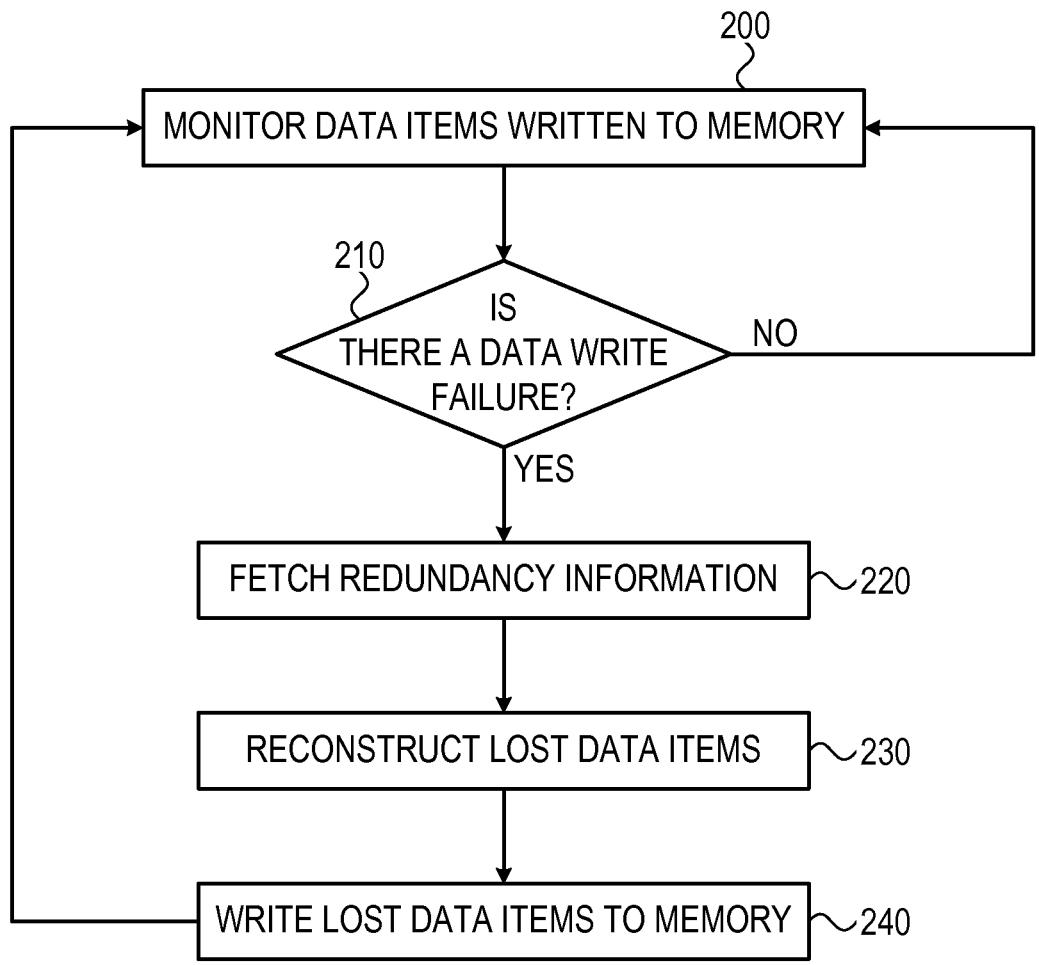
FIG. 3 is a flow chart that schematically illustrates a method for reconstructing lost data items from a write failure in nonvolatile memory, in accordance with an embodiment of the present invention.

FIG. 3 is a flow chart that schematically illustrates a method for reconstructing lost data items from a write failure in nonvolatile memory, in accordance with an embodiment of the present invention. In a monitor step 200, a set of data items written to memory device 24 are monitored by processor 48 of memory controller 40.

In a decision step 210, processor 48 validates if a data write failure event occurred. If not, memory controller 40 continues to monitor the data written to memory in monitor step 200. If so, processor 48 fetches the redundancy information for the set of pages from the predefined location in which it was written (write step 140 of FIG. 2). In a reconstruction step 230, processor reconstructs lost data items using the redundancy information. In a write step 240, the reconstructed lost data items are written to memory. Memory controller 40 then continues to monitor the data written to memory in monitor step 200.

Programming Schemes for Data Protection During a Write Failure

FIG. 2 and FIG. 3 both describe the general methods for writing and reconstructing data in the event of a write failure. If data loss occurs, the lost data can be reconstructed from redundancy information that is created during the predefined programming schemes. The following embodiments described below illustrate specific examples of predefined programming schemes for a number of different scenarios. The different embodiments consider various possibilities for the number of bits per memory cell, word line partitioning into odd and even cells, and the size of the data item to be written. Each programming scheme specifies a certain order of programming a set of pages, so as to prevent loss of previously-written data at any time.

In other words, the programming orders described below ensure that, whenever a write failure occurs, previous data is always recoverable using successfully stored data that is unaffected by the failure. The assumption in the following examples is that write failure may corrupt any data that was previously written to the same word line as the currently-written data. The disclosed techniques, however, are not limited to this assumption. In alternative embodiments, other assumptions can be made and suitable programming orders can be defined accordingly.

In some embodiments, processor 48 duplicates each page and stores a backup page as redundancy information, until the page write is validated. The overhead of this technique, however, is large. For odd/even two bits/cell memory, for example, three internal write protection operations are needed for four external data write operations.

In other embodiments, processor 48 writes the data pages sequentially to different blocks. When N blocks have been programmed, processor 48 creates a parity backup block such that data in the written blocks is protected. The memory overhead for backing up the parity block is 1/N. In an embodiment, the overhead can be made smaller since some of the data in the N blocks (e.g., the last page in each word line does not necessarily need protection).

Consider another example, used in a memory that stores different pages in the even cells and then the odd cells of each word line, using SLC storage. A write failure of the odd page of a word line can corrupt previously written data on the even page of the same word line. This SLC configuration supports programming pages out of order.

In this embodiment, processor 48 programs a set of fifteen data pages denoted L0 . . . L14, plus a parity page, according to Table 1 below:

TABLE 1

| SLC single even page/single odd page programming | | |
|---|---|---|
| WL | Even | Odd |
| 0 | L0 | L7 |
| 1 | L1 | L8 |
| 2 | L2 | L9 |
| 3 | L3 | L10 |
| 4 | L4 | L11 |
| 5 | L5 | L12 |
| 6 | L6 | L13 |
| 7 | XOR_CW (L0-L6) | L14 |

As can be seen in the table, the processor first programs pages L0 . . . L6 into the even cells of successive word lines. During the programming of the even cells, a write failure cannot corrupt previously written data, since the previous data was programmed to different word lines. Then, processor 48 programs the parity page into the even cells of the next word line, e.g., WL7, and shown as XOR_CW (L0-L6) in WL7.

The operator XOR_CW performs the logical XOR operation $\oplus$ on data pages that have been encoded with an ECC such as Low Density Parity Check (LDPC) or Bose-Chaudhuri-Hocquenghem (BCH). When executing this operator, processor 48 performs bit-wise XOR over only the data bits of the data pages without the ECC redundancy bits, and then encodes the XOR result with the ECC to produce a redundancy pages. (In an alternative embodiment, processor 48 may calculate the bit-wise XOR over all the bits of the data pages, including both data bits and ECC redundancy bits.

When the programming of pages L0-L6 into the even data pages of word lines WL0-WL6 is completed, as shown in Table 1, processor 48 detects that a backup page is needed (decision step 120), a parity backup page is created from pages L0-L6 (creation step 130) for even page data protection and written to the even page of WL7 (write step 140).

Then, processor 48 writes LSB data pages denoted L7-L14 into consecutive odd pages on WL0-WL7. When all of the data is written into the odd and even pages of WL0-WL7 (decision step 150), the parity data, in this example the XOR_CW page stored in the even cells of WL7, is discarded (step 160).

The indexing nomenclature of the data pages in Table 1, e.g., L1-L14, denotes LSB data ("L"), and the numbers denote the step numbers in the data write sequence into the eight word lines shown here (WL0-WL7) into which data is written. Thus L0 is the first data page to be written, L1, the second data page to be written, L2, the third data page to be written, and so forth. The nomenclature to denote the write sequence will be used in subsequent tables in describing additional programming schemes in the forthcoming embodiments.

In some memory devices, each even or odd SLC page is written in two halves, in two separate programming operations. An example programming order for use with such devices is shown in Table 2:

TABLE 2

SLC dual even page/dual odd page programming

| WL | Even | | Odd | |
|---|---|---|---|---|
| 0 | L0 | L7 | L14 | L21 |
| 1 | L1 | L8 | L15 | L22 |
| 2 | L2 | L9 | L16 | L23 |
| 3 | L3 | L10 | L17 | L24 |
| 4 | L4 | L11 | L18 | L25 |
| 5 | L5 | L12 | L19 | L26 |
| 6 | L6 | L13 | L20 | L27 |
| 7 | XOR_CW (L0-L6) | XOR_CW (L7-L13) | XOR_CW (L14-L20) | L28 |

In this embodiment too, processor 48 programs word lines "out of order" where all of the dual even pages are sequentially programmed followed by the dual odd pages. However, a parity page is created at the end of programming a sequential group of word lines and written into the last word line as shown in Table 2.

As seen in Table 2, processor 48 stores data sectors L0-L6 in the first half of the even cells of WL0-WL6, then stores a XOR_CW of L0-L6 in the first halves of the even cells of WL7. Then, processor 48 stores data sectors L7-L13 in the second halves of the even cells of WL0-WL6, then stores a XOR_CW of L7-L13 in the second half of the even cells of WL7. Then, processor 48 stores data sectors L14-L20 in the first halves of the odd cells of WL0-WL6, then stores a XOR_CW of L14-L20 in the first half of the odd cells of WL7. Finally, processor 48 stores data sectors L21-L28 in the second halves of the odd cells of WL0-WL7. At this stage, processor 48 discards (e.g., invalidates) the three XOR_CW sectors.

Note that the embodiments shown in Tables 1 and 2 are chosen merely for sake of conceptual clarity. For example, the odd pages can be programmed before the even pages. The parity data shown in Table 1 and Table 2 can be stored in a different memory block, or any other suitable storage medium, and discarded upon completion of the memory data write sequence. If the parity data is not stored in the same memory block, but to a different location, the XOR_CW operation will comprise the data written to all of the word lines in the even or odd pages, and now comprise the data from the WL7, e.g., XOR_CW (L0-L7), and so forth.

In some embodiments it is desirable to program the word lines in-order. In these embodiments, processor 48 may program the redundancy data for a set of pages into a different block, and later discard the redundancy data when the set of pages and the pages that may damage the data in the set of pages, is successfully written.

For MLC programming, when programming an MSB page to a word line, previously-written LSB data on the same word line may get corrupted in the event of a write failure (e.g., power failure). Table 3 below shows an example scheme for protection against such events, in accordance with an embodiment:

TABLE 3

MLC Programming with LSB and MSB pages

| WL | Even | Odd |
|---|---|---|
| 0 | L0 | L1 |
| 1 | L2 | L3 |
| 0 | M4 | M5 |
| 2 | L6 | L7 |
| 1 | M8 | M9 |
| 3 | L10 | L11 |
| 2 | M12 | M13 |
| 4 | L14 | L15 |
| 3 | M16 | M17 |

In the example shown in Table 3, when programming the MSB pages M16 or M17 in word line 3 (WL3), previously-written LSB pages L10 and/or L11 on WL3 can be corrupted in the event of a write failure. Here, in accordance with the nomenclature described previously, L2 denotes a second write step of an LSB data page in the sequence, for example, and M13 denotes a thirteenth write step of an MSB data page in the sequence.

In embodiments of the present invention, to minimize risks of data corruption in a write failure, an MLC programming scheme is implemented that programs the data into the word lines, creates redundancy information, and stores the redundancy information in a predefined location, typically in another block.

The redundancy creation flow described below for the MLC programming scheme uses the following nomenclature for the $i^{th}$ word line denoted WL(i), where i>0. In an embodiment, processor 48 carries out the MLC programming order shown in Table 3. In conjunction with this programming order, processor 48 carries out the following redundancy scheme:
1. Read [LSB Even of WL(i−1)]
2. Program [LSB Even WL(i)]
3. Program {[LSB Even WL(i)] XOR_CW [LSB Even WL(i−1)]} to Redundancy (1)
4. Program [LSB Odd WL(i)]
5. Read [LSB Odd WL(i)] <no need for this step if data stored in step 4>
6. Program [MSB Even WL(i−1)]
7. Program {[MSB Even WL(i−1)] XOR_CW [LSB Odd WL(i)]} to Redundancy (2)
8. Program [MSB Odd WL(i−1)]

Step 3 stores Redundancy (1) for the even LSB pages while writing the odd pages. Similarly, step 7 stores Redundancy (2) of the odd LSB pages, which were not previously stored. Step 7 stores the redundancy for the even MSB pages while writing the odd pages. For the specific case of i=0, the steps are:
1. Program [LSB Even WL (0)]
2. Program [LSB Even WL (0)] to Redundancy
3. Program [LSB Odd WL (0)]

The MLC programming scheme in Table 3 and the corresponding redundancy creation flow yields two redundancy pages (code words) for every four data programming write steps, i.e., a coding rate of ½. For the above MLC programming scheme to operate correctly, two redundancy code words should typically be available at any given time for the even cells and two redundancy code words the odd cells. When a third redundancy code word is created, the first redundancy code word may be discarded, and so forth.

Data can be restored during the MLC programming scheme in the event of a write failure using the following MLC data restore scheme:
1. LSB Even WL(i)={[Redundancy (1)] XOR_CW [LSB Even WL(i−1)]
2. LSB Odd WL(i)={[MSB Even WL(i−2)] XOR_CW [Redundancy (2)]
3. MSB Even WL(i−1)={[Redundancy (2)] XOR_CW [LSB Odd WL (i)]

In yet another embodiment, the memory device supports a TLC programming scheme, in which LSB, CSB, and MSB data pages are programmed into odd and even memory cells according to the following order:

TABLE 4

TLC Programming LSB, MSB, and CSB data pages into odd/even memory cells on word lines

| WL | Even | Odd |
|---|---|---|
| 0 | L0 | L1 |
| 1 | L2 | L3 |
| 0 | C4 | C5 |
| 2 | L6 | L7 |
| 1 | C8 | C9 |
| 0 | M10 | M11 |
| 3 | L12 | L13 |
| 2 | C14 | C15 |
| 1 | M16 | M17 |
| 4 | L18 | L19 |
| 3 | C20 | C21 |
| 2 | M22 | M23 |
| 5 | L24 | L25 |
| 4 | C26 | C27 |
| 3 | M28 | M29 |

Here, in accordance with the nomenclature described previously, L2 denotes a second write step of an LSB data page in the sequence, C9 denotes a ninth write step of a CSB data page, and M16 denotes a sixteenth write step of an MSB data page. In this embodiment, during the TLC programming flow of Table 4, processor 48 produces redundancy data follows (for i>1 assuming that even and odd pages can be programmed together without data loss, since the data is saved elsewhere):
1. Read [LSB Even WL(i−1)]
2. Program [LSB Even WL(i)]
3. Program [LSB Odd WL(i)]
4. Program [CSB Even WL(i−1)]
5. Read [LSB Even WL(i)] <no need for this step if data stored in step 2>
6. Program {[LSB Even WL(i)] XOR_CW [CSB Even WL(i−1)] to Redundancy (1)
7. Program [CSB Odd WL(i−1)]
8. Program {[LSB Odd WL(i)] XOR_CW [CSB Odd WL(i−1)] to Redundancy (2)
9. Program [MSB Even WL(i−2)]
10. Program [MSB Odd WL(i−2)]

For this TLC programming scheme, the programming scheme yields two redundancy code words for every six data programming write steps, or a coding rate of ⅓. For the above programming scheme to operate correctly, 3*2 redundancy code words should typically be available at any given time. Once the data is written in accordance with the programming scheme, the redundancy code words may be discarded.

In other embodiments where during a program write, the previously-written even page data can be corrupted while writing the odd page data in the event of a write failure. In such embodiments, processor 48 may produce the redundancy data as follows:

1. Read [LSB Even WL(i−1)]
2. Program [LSB Even WL(i)]
3. Program {[LSB Even WL(i)] XOR_CW [LSB Even WL(i−1)] to Redundancy (1)
4. Program [LSB Odd WL(i)]
5. Program [CSB Even WL(i−1)]
6. Program {[LSB Odd WL(i)] XOR_CW [CSB Even WL(i−1)] to Redundancy (2)
7. Program [CSB Odd WL(i−1)]
8. Program [MSB Even WL(i−2)]
9. Program {[CSB Odd WL(i−1)] XOR_CW [MSB Even WL(i−2)] to Redundancy (3)
10. Program [MSB Odd WL(i−2)]

This programming scheme yields three redundancy code words for every six data programming write steps, or a coding rate of ½. For the above programming scheme to operate correctly, 3*3 redundancy code words should typically be available at any given time. Once the data is written in accordance with the programming scheme, the redundancy may be discarded.

In yet another embodiment, the memory device supports a TLC All Bit Lines (ABL) programming scheme, in which there are no odd and even cell divisions on a word line. The LSB, CSB, and MSB data is programmed directly on to the word lines in the sequence of steps as shown in Table 5:

TABLE 5

TLC ABL Programming of LSB, MSB, and CSB page data

| WL | Page |
|---|---|
| 0 | L0 |
| 1 | L1 |
| 0 | C2 |
| 2 | L3 |
| 1 | C4 |
| 0 | M5 |
| 3 | L6 |
| 2 | C7 |
| 1 | M8 |
| 4 | L9 |
| 3 | C10 |
| 2 | M11 |
| 5 | L12 |
| 4 | C13 |
| 3 | M14 |

In this embodiment, processor 48 may carry out the following redundancy creation flow:
1. Read [LSB WL(i−1)]
2. Program [LSB WL(i)]
3. Program [CSB WL(i−1)]
4. Read [LSB WL(i)] <no need for this step if data stored in step 2>
5. Program {[LSB WL(i)] XOR_CW [CSB WL(i−1)]} to Redundancy (1)
6. Program [MSB WL(i−2)]

For this TLC ABL programming scheme, this programming scheme yields one redundancy code word for every three data programming write steps, or a coding rate of ⅓. For the above programming scheme to operate correctly, 3*2 redundancy code words should typically be available at any given time. Once the data is written in accordance with the programming scheme, the redundancy may be discarded.

The programming schemes shown in Tables 1-5 are chosen purely for the sake of conceptual clarity and not by way of limitation of the embodiments of the present invention. The techniques of creating redundancy information during a program write flow as a means to protect the previously written data in the event of a write failure, such as power loss protection, can be combined with block interleaving to obtain new programming schemes with less redundancy overhead.

The embodiments described herein refer mainly to XOR-based redundancy. In other embodiments, processor 48 may produce the redundancy information using any suitable redundancy schemes other than XOR. For example, processor 48 may use a suitable ECC for this purpose. If the ECC can correct two errors, for example, then two pages that can be corrupted together may be included in the same set of pages protected by the ECC.

Although the embodiments described herein mainly address protecting data in non-volatile memory during write failures, the methods and systems described herein can also be used in other applications, such as for protecting data in any memory that experiences other failure mechanisms, or memories comprising other geometries as in three-dimensional memory cell arrays.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
    receiving data for storage in a memory device, wherein the memory device includes a plurality of memory cells, and wherein the data includes a plurality of pages;
    storing a first page of the plurality of pages in a first group of the plurality of memory cells;
    determining if data stored in the first group of the plurality of memory cells is subject to corruption due to a subsequent storage of a second page of the plurality of pages;
    calculating redundancy information over the first page of data in response to determining that the data stored in the first group of the plurality of memory cells is subject to corruption due to the subsequent storage of the second page of the plurality of pages;
    storing the redundancy information in the memory device;
    storing the second page of the plurality of pages;
    discarding the redundancy information in response to determining the data has been stored; and
    recovering at least a portion of the first page of data using the redundancy information in response to determining the at least a portion of the first page of data has been corrupted.

2. The method according to claim 1, wherein discarding the redundancy information comprises determining a completion of write operations of the second page of the plurality of pages.

3. The method according to claim 1, wherein discarding the redundancy information comprises determining a completion of storing each page of the plurality of pages.

4. The method according to claim 1, further comprising storing both the first page of the plurality of pages and the redundancy information in a same memory block of the memory device.

5. The method according to claim 1, further comprising storing both the first page of the plurality of pages and the redundancy information in the memory device in accordance with a predefined page programming order.

6. The method according to claim 1, further comprising storing the first page of the plurality of pages in a first memory block of the memory device, and storing the redundancy information in a second memory block of the memory device, wherein the second memory block is different from the first memory block.

7. The method according to claim 6, wherein the second memory block is dedicated for redundancy information storage.

8. The method according to claim 1, wherein each memory cell of the first group of the plurality of memory cells is coupled to a first word line of the memory device; wherein storing the redundancy information comprises storing the redundancy information to a second group of memory cells of the plurality of memory cells, wherein each memory cell of the second group memory cells is coupled to a second word line; and wherein storing the second page of the plurality of pages comprises storing the second page in a third group of the plurality of memory cells, wherein each memory cell of a first portion of the third group of memory cells is coupled to the first word line, and wherein each memory cell of a second portion of the third group of memory cells is coupled to the second word line.

9. The method according to claim 1, wherein storing the redundancy information comprises storing the redundancy information in a storage location excluding the memory device.

10. An apparatus, comprising:
    an interface for communicating with a memory, wherein the memory includes a plurality of memory cells; and
    a processor configured to:
    store a first of a plurality of data pages in a first group of the plurality of memory cells;
    determine if data stored in the first group of the plurality of memory cells is subject to corruption due to a subsequent storage of a second page of the plurality of data pages;
    calculate redundancy information over the first page of the plurality of data pages in response to a determination that the data stored in the first group of the plurality of memory cells is subject to corruption due to the subsequent storage of the second page of the plurality of data pages;
    store the redundancy information in the memory;
    store the second page of the plurality of data pages in the memory;
    discard the redundancy information in response to a determination that the plurality of data pages has been stored; and
    recover at least a portion of the first page of the plurality of data pages using the redundancy information in response to a determination that the at least a portion of the first page has been corrupted.

11. The apparatus according to claim 10, wherein to discard the redundancy information, the processor is further configured to determine a completion of write operations of the second page of the plurality of data pages.

12. The apparatus according to claim 10, wherein to discard the redundancy information, the processor is further configured determine a completion of storing each page of the plurality data pages.

13. The apparatus according to claim 10, wherein the processor is further configured to store both the first page of the plurality of data pages and the redundancy information in a same memory block of the memory.

14. The apparatus according to claim 10, wherein the processor is further configured to store both the first page of the plurality of data pages and the redundancy information in the memory in accordance with a predefined page programming order.

15. The apparatus according to claim 10, wherein the processor is further configured to store the first page of the plurality of data pages in a first memory block of the memory, and store the redundancy information in a second memory block of the memory, wherein the second block is different from the first memory block.

16. The apparatus according to claim 15, wherein the second memory block is dedicated for redundancy information storage.

17. The apparatus according to claim 10, wherein each memory cell of the first group of the plurality of memory cells is coupled to a first word line of the memory device; and wherein to store the redundancy information the processor is further configured to stored the redundancy information in a second group of memory cells of the plurality of memory cells, wherein each memory cell of the second group of memory cells is coupled to a second word line; and wherein to store the second page of the plurality of data pages, the processor is further configured to store the second page of the plurality of data pages to a third group of memory cells, wherein each memory cell of a first portion of the third group of memory cells is coupled to the first word line, and wherein each memory cell of a second portion of the third group of memory cells is coupled to the second word line.

18. The apparatus according to claim 10, wherein the processor is further configured to store the redundancy information in a storage location outside the memory.

19. An apparatus, comprising:
a memory, wherein the memory includes a plurality of memory cells; and a processor configured to:
store a first page of a plurality of data pages in a first group of the plurality of memory cells;
determine if data stored in the first group of the plurality of memory cells is subject to corruption due to a subsequent storage of a second page of the plurality of data pages;
calculate redundancy information over the first page of the plurality of data pages in response to a determination that the data stored in the first group of the plurality of memory cells is subject to corruption due to the subsequent storage of the second page of the plurality of data pages;
store the redundancy information in the memory;
store the second page of the plurality of data pages in the memory;
discard the redundancy information in response to a determination that the plurality of data pages has been stored; and
recover at least a portion of the first page of the plurality of data pages using the redundancy information in response to a determination that the at least a portion of the first page has been corrupted.

20. The apparatus according to claim 19, wherein to discard the redundancy information the processor is further configured to determine a completion of write operations of the second page of the plurality of data pages.

* * * * *